(12) United States Patent  
Pereira

(10) Patent No.: US 6,718,433 B1
(45) Date of Patent: Apr. 6, 2004

(54) MATCH AND PRIORITY ENCODING LOGIC CIRCUIT

(75) Inventor: Jose Pio Pereira, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 34 days.

(21) Appl. No.: 10/243,076

(22) Filed: Sep. 12, 2002

Related U.S. Application Data

(63) Continuation of application No. 09/733,819, filed on Dec. 8, 2000, now Pat. No. 6,490,650.

(51) Int. Cl.[7] ............................................. G06F 12/02
(52) U.S. Cl. ..................................................... 711/108
(58) Field of Search ................................. 711/108, 115

(56) References Cited

U.S. PATENT DOCUMENTS

| | | | |
|---|---|---|---|
| 5,852,569 A | | 12/1998 | Srinivasan et al. ............ 365/49 |
| 5,930,359 A | * | 7/1999 | Kempke et al. ................ 380/9 |
| 6,000,008 A | | 12/1999 | Simcoe ........................ 711/108 |
| 6,253,280 B1 | | 6/2001 | Voelkel ....................... 711/108 |
| 6,381,673 B1 | | 4/2002 | Srinivasan et al. ......... 711/108 |

* cited by examiner

Primary Examiner—Kevin L. Ellis
(74) Attorney, Agent, or Firm—William L Paradice, III

(57) ABSTRACT

A plurality of match and priority encoding logic (MPL) circuits are connected in a chain. Each MPL circuit includes a plurality of input terminals coupled to an associated set of match lines from a content addressable memory (CAM) array, an index input port to receive an input index from a previous MPL circuit, an index output port to provide an output index to a next MPL circuit, and a select terminal to receive a select signal.

27 Claims, 9 Drawing Sheets

MATCH AND PRIORITY ENCODING LOGIC CIRCUIT

CROSS-REFERENCE TO RELATED APPLICATION

This application is a continuation of co-pending and commonly owned U.S. patent application Ser. No. 09/733,819 entitled "METHOD AND APPARATUS FOR GENERATING A DEVICE INDEX IN A CONTENT ADDRESSABLE MEMORY," filed on Dec. 8, 2000 now U.S. Pat. No. 6,490,650.

FIELD OF INVENTION

This invention relates generally to content addressable memories and specifically to generating a device index in a content addressable memory.

BACKGROUND

A content addressable memory (CAM) is a storage device that can be instructed to retrieve information based upon a comparison of a comparand word with data words stored in the CAM. FIG. 1 shows a CAM device 100 having an array of memory cells 102 and an associated priority logic circuit 104. The CAM array 102 includes k rows of memory cells. Each row of memory cells stores a CAM word, and is connected to the logic 104 via a corresponding match line ML. The priority logic circuit 104 includes well-known match logic, multiple match logic, and a priority encoder. During compare operations, the comparand word is received at appropriate input terminals of the CAM device 100 and then compared with the CAM words stored in the CAM array 102. For each CAM word that matches the comparand word, its corresponding match line ML is asserted to indicate the match condition.

In response to the asserted match line ML, the priority logic circuit 104 asserts a match flag MF, and outputs the index of the matching CAM word. If there are multiple matches, the priority logic circuit 104 asserts a multiple match flag MMF, and selects one of the matching CAM words to be output from the CAM device 100. When there are multiple matches, priority logic circuit 104 selects the highest priority match, which is typically defined as the matching CAM word that has the lowest CAM index, although other priority schemes may be used. The index of the highest priority match, the contents of the matched location, and other status information (e.g., skip bit, empty bit, and full flag, as well as the match and multiple match flags) may be output from the CAM device 100 to an output bus (not shown in FIG. 1).

FIG. 2 shows a conventional architecture 200 of the priority logic circuit 104. The priority logic circuit 200 includes n well-known match and priority encoding logic (MPL) circuits 202(1)–202(n), a control circuit 204, a multiplexer (MUX) 206, and a concatenation node 208. Each MPL circuit 202(1)–202(n) receives a corresponding set of match lines ML_1 to ML_n, respectively, where each match line set ML_1 to ML_n includes x match lines from the CAM array 102 (see also FIG. 1). In response to its corresponding set of match lines ML, each MPL circuit 202(1)–202(n) provides a respective match flag MF_1 to MF_n to the control circuit 204 via corresponding signal lines 208(1)–208(n). Also, although not shown in FIG. 2 for simplicity, each MPL circuit 202(1)–202(n) may provide a multiple match flag MMF to the control circuit 204.

If there is a match condition within its corresponding match line set ML, each MPL circuit 202(1)–202(n) provides the highest priority matching index I_1 to I_n, respectively, to the MUX 206 via corresponding index buses 210(1)–210(n). Each index I_1 to I_n, and thus each index bus 210(1)–210(n), is y=$\log_2$x bits wide. Using the match flags MF_1 to MF_n, the control circuit 204 identifies the highest priority MPL circuit 202(1)–202(n) that detects a match condition and, in response thereto, provides a select signal to the MUX 206 to select the index I from that MPL circuit 202 to provide as an input signal to the concatenation node 208. The control circuit 204 also generates an m-bit set ID that identifies the index of the highest priority match line set that has a match condition. The set ID is provided to the concatenation node 208, and concatenated therein as the most significant bits (MSB's) to the index I received from the MUX 206 to form a z-bit device index I_dev, where z=y+m. The device index is the index or address of the highest priority match in the entire CAM array.

The priority logic circuit 200 of FIG. 2 requires a significant number of signal lines to carry each of the indexes I_1 to I_n from respective MPL circuits 202(1)–202(n) to the MUX 206. Because of the 2 dimensional spacial relationship between the MPL circuits 202 and the MUX 206, the index buses 210 from the MPL circuits 202 located farthest from the MUX 206 (e.g., MPL circuit 202(1), then MPL circuit 202(2), and so on), are quite long and occupy significant silicon area. For example, as illustrated in FIG. 2, the index buses 210(1)–210(n) each run in both the horizontal and vertical directions, where each index bus 210(1)–210(n) is routed past all subsequent MPL circuits 202 to reach the MUX 206. As the size of CAM devices increases, the number and length of the index buses 210 increases, thereby consuming even greater silicon area. Accordingly, it would be desirable to reduce the amount of silicon area occupied by the index buses 210.

SUMMARY

A method and apparatus are disclosed that generate a device index in a CAM device. In accordance with the present invention, the match lines of a CAM array are grouped into a plurality of sets. The match lines within each set are provided to a corresponding match and priority encoding logic (MPL) circuit. Each MPL circuit includes an input index terminal connected to an index output terminal of a previous MPL circuit, and includes an index output terminal connected to the index input terminal of a next MPL circuit. In response to match signals provided by its corresponding match line set, each MPL circuit generates a match flag, a multiple match flag, and the index of the highest priority match for the set. The match flags and multiple match flags from each MPL circuit are provided to a control circuit. The last MPL circuit has an index output terminal connected to an index input terminal of the control circuit.

In response to the match flags, the control circuit generates a plurality of select signals, each of which is provided to a corresponding MPL circuit. In response to its corresponding select signal, each MPL circuit selectively provides either the set index generated therein or a input set index received from the previous MPL circuit to the next MPL circuit. The control circuit asserts the select signals in a manner such that the index from the highest priority match line set ripples through one or more of the MPL circuits to the control circuit. The control circuit also generates a set ID that identifies the highest priority matching set. The set ID is concatenated as the most significant bit(s) to the selected set index to form the device index.

By rippling the highest priority set index through the MPL circuits to the control circuit, present embodiments may significantly reduce the length of the index buses. Thus, rather than routing an index bus from each MPL circuit to the control circuit, present embodiments route index buses between adjacent MPL circuits. The reduction in index signal lines and signal line lengths achieved by present embodiments may advantageously reduce the silicon area occupied thereby.

In some embodiments, a hierarchical scheme may be used.

BRIEF DESCRIPTION OF THE DRAWINGS

Like reference numerals refer to corresponding parts throughout the drawing figures.

DETAILED DESCRIPTION

Present embodiments are discussed below in the context of a CAM architecture 300 for simplicity only. It is to be understood that present embodiments are equally applicable to CAM architectures of other sizes and configurations. Further, the particular logic levels assigned to signals discussed herein is arbitrary and, thus, may be reversed where desirable. Accordingly, the present invention is not to be construed as limited to specific examples described herein but rather includes within its scope all embodiments defined by the appended claims.

Figure 3:
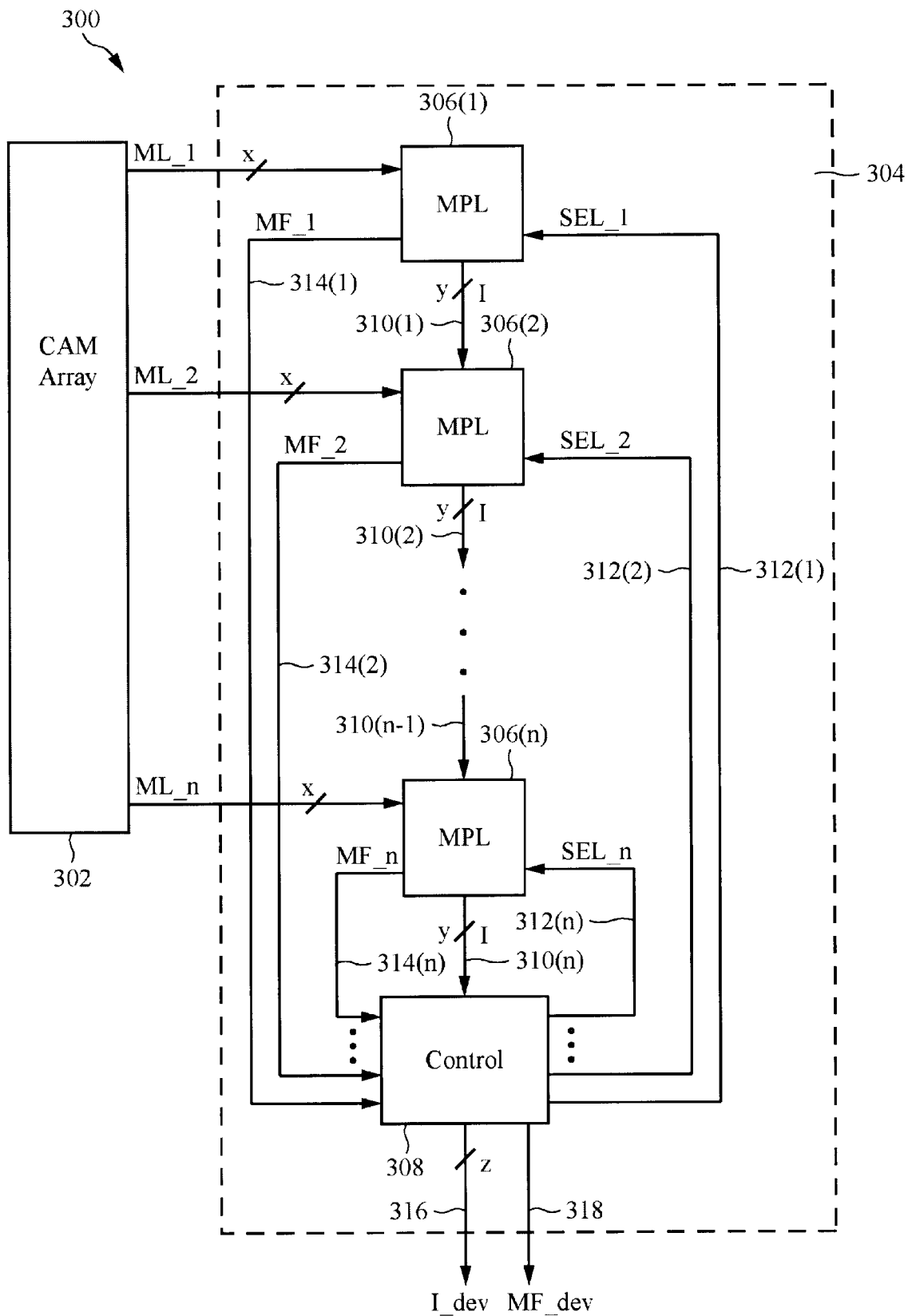
FIG. 3 is a block diagram illustrating a priority logic circuit in accordance with the present invention.

FIG. 3 shows a CAM device 300 having a CAM array 302 connected to a priority logic circuit 304 configured in accordance with the present invention. The CAM array 302 has a plurality of rows of CAM cells for storing a plurality of CAM words therein. The CAM array 302 may be any suitable type of CAM array including, for example, synchronous, asynchronous, binary, and ternary CAMs. Further, the CAM array 302 may be any suitable size. In one embodiment, the CAM array 302 includes 2k (2048) rows of CAM cells. The CAM array 302 provides a plurality of match line signals indicative of match conditions in the CAM array 302 to the logic circuit 304 via corresponding match lines ML.

The priority logic circuit 304 includes a number of match and priority encoding logic (MPL) circuits 306(1)–306(n) and a control circuit 308 connected in a chain. Each of the MPL circuits 306(1)–306(n) receives from the CAM array 302 a corresponding set of match lines ML_1 to ML_n, respectively, where each match line set ML_1 to ML_n includes x match lines. For other embodiments, the match line sets may include a dissimilar number of match lines. In the embodiment of FIG. 3, the first MPL circuit 306(1) receives the highest priority set of match lines (e.g., CAM indexes 0 to x–1), the second MPL circuit 306(2) receives the next highest priority set of match lines (e.g., CAM indexes x to 2x–1), and so on, where the last MPL circuit 306(n) receives the lowest priority set of match lines (e.g., CAM indexes (n–1)x to nx–1), although in actual embodiments priority may be reversed or otherwise modified. Each MPL circuit 306(1)–306(n) includes an index output port connected to an index input port of the next MPL circuit 306 in the chain via corresponding y-bit index buses 310(1)–310(n). The index input port of the first MPL circuit 306(1) is disabled, or set to a predetermined state, and the index output port of the last MPL circuit 306(n) is connected to an index input port of the control circuit 308.

During compare operations, a comparand word or search key is compared with the CAM words stored in the CAM array 302. For each matching CAM word, the corresponding match line ML is asserted (e.g., to logic high) to indicate the match condition. For each of the MPL circuits 306(1)–306(n), if there is a match condition detected within its corresponding set of match lines, the MPL circuit 306 asserts (e.g., to logic high) a corresponding match flag MF_1 to MF_n, and generates a local or set index of the highest priority match within the corresponding set of rows of CAM cells in the CAM array 302. The index is the address in the CAM array 302 at which the matching entry is stored. The match flags MF_1 to MF_n are provided to the control circuit 308 via signal lines 314(1)–314(n), respectively. In response to the match flags MF_1 to MF_n, the control circuit 308 generates select signals SEL_1 to SEL_n, which in turn are provided to the MPL circuits 306(1)–306(n) via signal lines 312(1)–312(n), respectively. In response to respective select signals SEL_1 to SEL_n, each of the MPL circuits 306(1)–306(n) selectively forwards either the set index generated therein or the set index received from the previous MPL circuit 306 to the next MPL circuit 306. The control circuit 308 selectively asserts the select signals SEL_1 to SEL_n so that the set index of the highest priority match for the entire CAM array 302 ripples through one or more of the MPL circuits 306(1)–306(n) to the control circuit 308 to form the least significant bits (LSB's) of the device index I_dev. The device index is the index or address of the highest priority match in the entire CAM array 302.

Control circuit 308 also generates the MSB's of I_dev. The MSB's of I_dev indicate which of the match line sets ML_1 to ML_n contains the highest priority match in the entire array 302, and thus also indicates which of the MPL circuits 306(1)–306(n) generated the set index that forms the LSB's of I_dev. For one embodiment, each set or group of rows of CAM cells coupled to the match line sets has a group or block address or index. For example, the set of rows of CAM cells coupled to ML_1 may have a group address of 0, the set of rows of CAM cells coupled to ML_2 may have a group address of 1, and so on. For this embodiment, the MSB's of I_dev can be the group address of the set of rows of CAM cells that store the highest priority match for the entire CAM array. For example, the MSB's of I_dev can be determined from the match flags MF_1 to MF_n. For one embodiment, control circuit 308 encodes the match flags to generate the MSB's of I_dev.

Additionally, control circuit 308 may also generate a device match flag MF_dev on line 318 for the entire CAM array 302 in response to the match flags MF_1 to MF_n. Further, in some embodiments, control circuit 308 may also generate a device multiple match flag MMF_dev for the entire CAM array 302. In such embodiments, each MPL circuit 306(1)–306(n) may provide a multiple match flag (not shown) indicative of a multiple match condition within its corresponding set of match lines to the control circuit 308, which in turn generates the device multiple match flag in response to the match flags MF_1 to MF_n and multiple match flags (not shown).

Specifically, in one embodiment, the control circuit 308 asserts (e.g., to logic high) the select signal corresponding to the highest priority MPL circuit 306 that detects a match condition, and de-asserts (e.g., to logic low) all other select signals. For example, if there is a match condition within the first set of match lines ML_1, the first MPL circuit 306(1) asserts its match flag MF_1 on line 314(1), and generates the local or set index of the highest priority match from within the CAM words coupled to match line set ML_1. Because the first match line set ML_1 corresponds to the highest priority CAM indexes, the set index generated by the first MPL circuit 306(1) is the highest priority match for the entire array 302. In response thereto, the control circuit 308 asserts SEL_1 so that MPL circuit 306(1) provides its set index generated therein to the second MPL circuit 306(2) via bus 310(1), and de-asserts SEL_2 to SEL_n so that respective MPL circuits 306(2)–306(n) pass the set index generated by the first MPL circuit 306(1) to the control circuit 308 to form the LSB's of I_dev. Control circuit 308 also generates the MSB's (e.g., all zeros in this example) of I_dev in response to MF_1 to MF_n.

On the other hand, if there is not a match condition in the first match line set ML_1, but there is a match condition in the second match line set ML_2, the second MPL circuit 306_2 asserts its match flag MF_2 via line 314(2), and generates the local or set index of the highest priority match within the set. For example, if each match line set ML_1 and ML_2 includes 4 match lines coupled to corresponding rows of CAM cells in the array 302, and the second row in the group of CAM cells coupled to ML_2 is the highest priority match within this group, then MPL circuit 306(2) outputs a local or set index of 2 on output bus 310(2). In response to the asserted match flag MF_2, the control circuit 308 asserts SEL_2 and de-asserts SEL_3 to SEL_n. In response thereto, the second MPL circuit 306(2) forwards the set index generated therein to the third MPL circuit 306(3) via bus 310(2), and the MPL circuits 306(3)–306(n) pass the set index from the second MPL circuit 306(2) to the control circuit 308 to form the LSB's of I_dev. Control circuit 308 also generates the MSB's (e.g., 001 in this example, where there are eight MPL circuits) of I_dev in response to MF_1 to MF_n.

Figure 1:
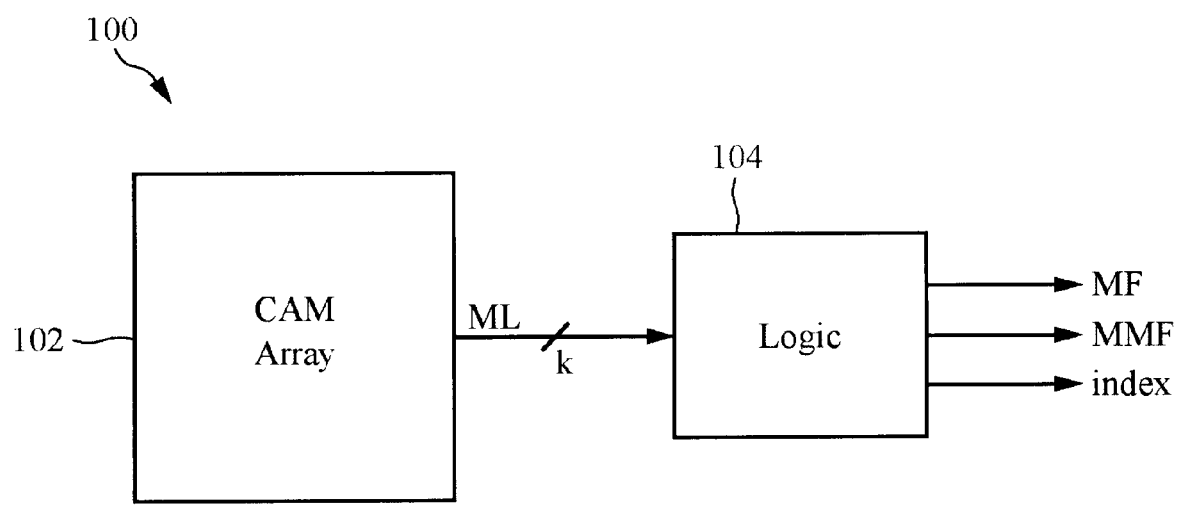
FIG. 1 is a simplified block diagram of a CAM device having a memory array and an associated priority logic circuit.
Figure 2:
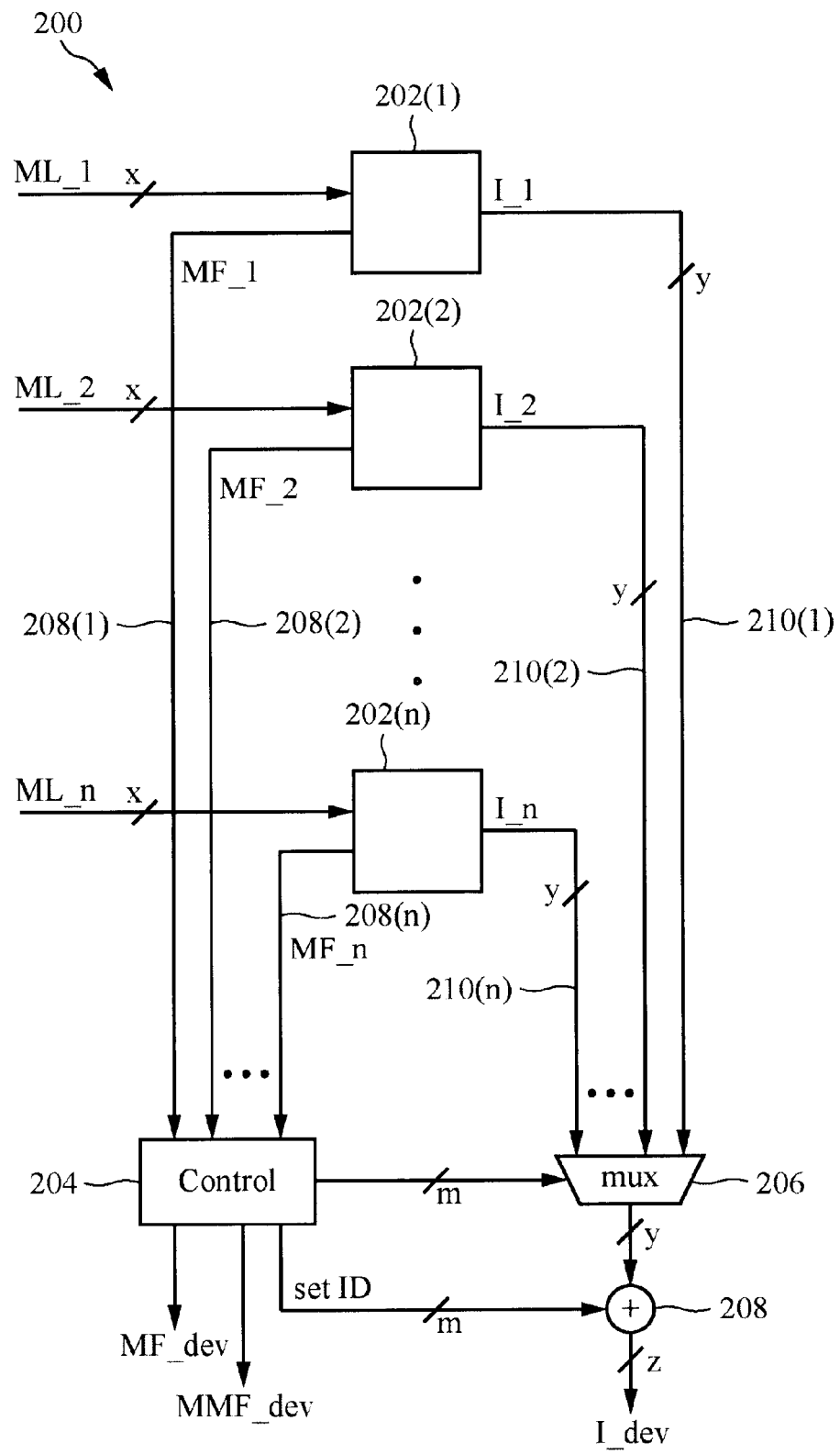
FIG. 2 is a block diagram of a conventional priority logic circuit.

By rippling the set index through the MPL circuits 306(1)–306(n) to the control circuit 308, the corresponding y-bit index buses 310(1)–310(n) need only be routed in the vertical direction between adjacent MPL circuits 306, rather than from each MPL circuit 306 to the control circuit 308. In this manner, the index buses 310(1)–310(n) of the embodiment of FIG. 3 may be significantly shorter than prior techniques, thereby reducing RC delays and increasing throughput. Additionally, less silicon area may be used by the index buses 310(1)–310(n) than, for example, the index buses 210(1)–210(n) of the prior art architecture of FIG. 2.

Figure 4:
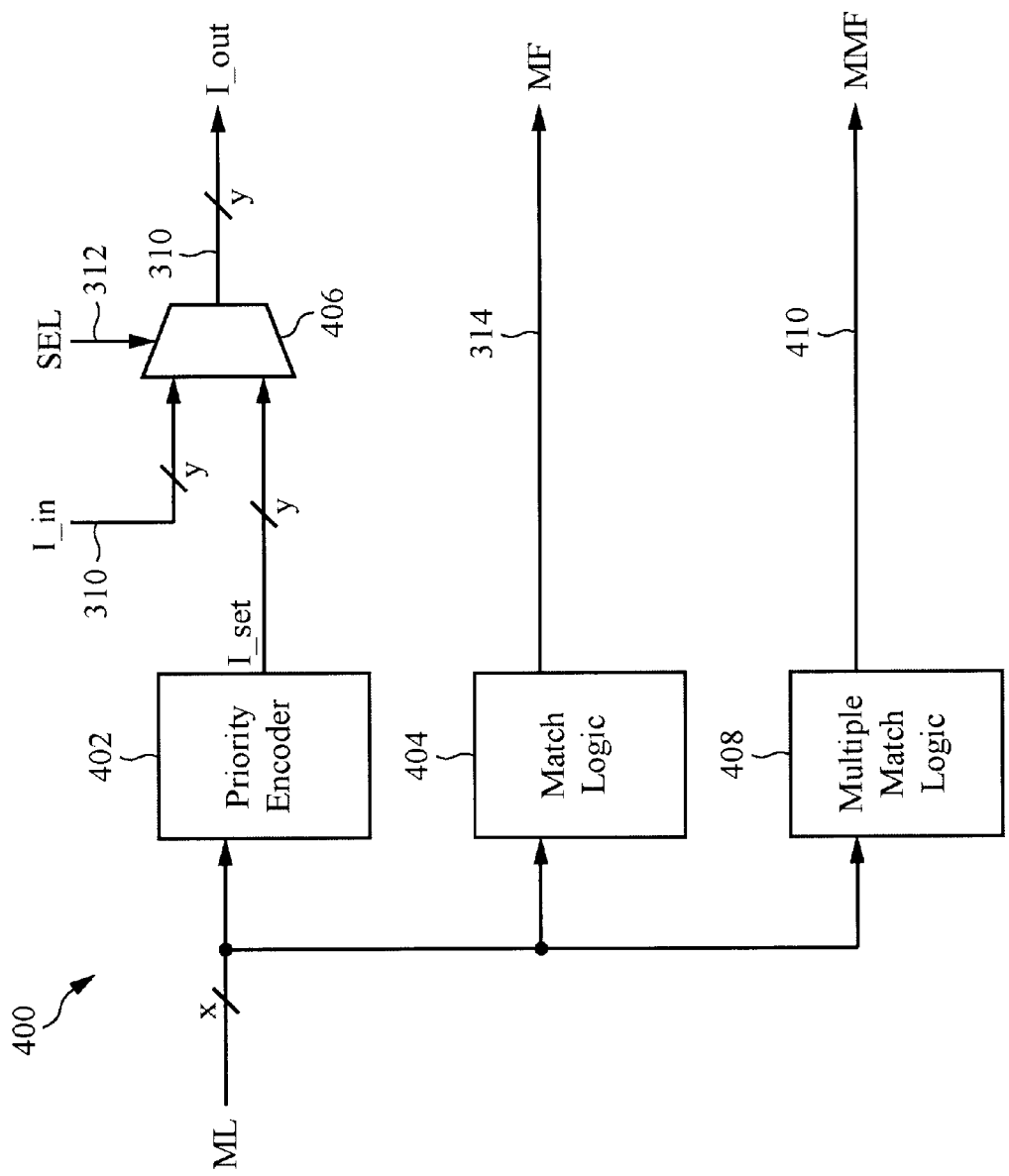
FIG. 4 is a block diagram of one embodiment of the match and priority encoding logic (MPL) circuit shown in FIG. 3.

FIG. 4 shows an MPL circuit 400 that is one embodiment of the MPL circuits 306 of FIG. 3. The MPL circuit 400 includes a priority encoder 402, a match logic circuit 404, a MUX 406, and a multiple match logic circuit 408. The match line signals from the corresponding set of x match lines ML are provided as input signals to the priority encoder 402, the match logic circuit 404, and the multiple match logic circuit 408. The match logic circuit 404 is a well-known circuit that asserts a corresponding match flag MF on line 314 if there is a match condition indicated on any of the set of match lines ML. In one embodiment, the match logic circuit 404 is an OR gate. The multiple match logic circuit 408 is a well-known circuit that asserts a corresponding multiple match flag MMF on line 410 if there is a multiple match condition for the corresponding match line set ML. In some embodiments, the multiple match logic circuit 408 may be external to the control circuit 400. In other embodiments, the multiple match logic circuit 408 may be omitted.

The priority encoder 402 is a well-known circuit that generates the index I_set of the highest priority match for the corresponding match line set ML. I_set, which is $y=\log_2 x$ bits wide, is provided to a first input terminal of the MUX 406. The second input terminal of the MUX 406 is coupled to receive an input set index I_in from the previous MPL circuit in the chain. In response to the select signal SEL received at its control terminal, the MUX 406 outputs either the set index I_set generated by its associated priority encoder 402 or the set index I_in received from the previous MPL circuit onto lines 310 as an output set index I_out, which is provided as an input index to the next MPL circuit in the chain.

Figure 5:
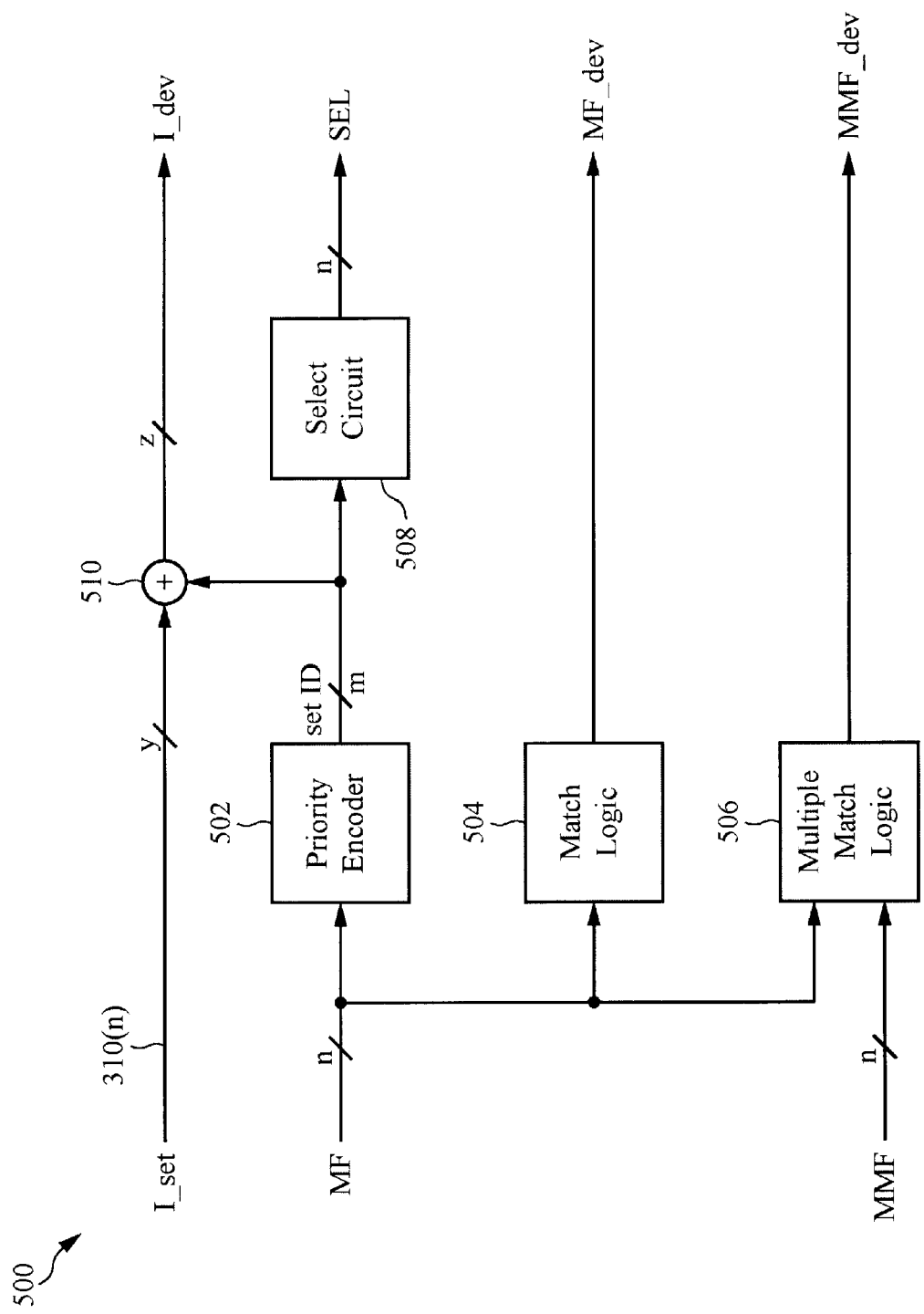
FIG. 5 is a block diagram of one embodiment of the control circuit shown in FIG. 3.

FIG. 5 shows a control circuit 500 that is one embodiment of the control circuit 308 of FIG. 3. The control circuit 500 includes a priority encoder 502, a match logic circuit 504, a multiple match logic circuit 506, a select circuit 508, and a concatenation node 510. The match flags MF_1 to MF_n generated by the MPL circuits 306(1)–306(n) are provided as input signals to the priority encoder 502, the match logic circuit 504, and the multiple match logic circuit 506. The multiple match logic circuit 506, which also receives multiple match flags MMF from each of the MPL circuits 400, asserts the device multiple match flag MMF dev if there is more than match in the CAM array 302. The match logic circuit 504 asserts the device match flag MF_dev if there is a match condition within the CAM array 302, i.e., if any of the match flags MF_1 to MF_n from the MPL circuits 306(1)–306(n) are asserted. In one embodiment, the match logic circuit 504 is an OR gate.

In response to the match flags MF_1 to MF_n, the priority encoder 502 generates a set ID corresponding to the highest priority MPL circuit that detects a match condition. The set ID, which is $m=\log_2 n$ bits wide, is concatenated as the MSB's with the set index I_set rippled through MPL circuits 306(1)–306(n) in the concatenation node 510 to generate a z-bit device index I_dev, where z=y+m. The m-bit set ID is also provided as an input signal to the select circuit 508 which, in response thereto, generates the select signals SEL_1 to SEL_n for the MPL circuits 306(1)–306(n), respectively. As mentioned above, SEL_1 to SEL_n instruct respective MPL circuits 306(1)–306(n) whether to forward the highest priority matching index generated therein or the input index received from the previous MPL circuit to the next MPL circuit. For one embodiment, select circuit 508 is a decoder.

Specifically, the select circuit 508 provides an asserted select signal to the highest priority MPL circuit 306 that detects a match condition in the corresponding set of match lines ML, and provides de-asserted select signals to all other MPL circuits 306. In response thereto, the highest-priority MPL circuit 306 that detects a match condition provides the highest priority set index generated therein to the next MPL circuit which, along with all subsequent MPL circuits in the chain, passes that set index to the concatenation node 510 where, as described above, it is concatenated with a set ID to form I_dev. For example, in an embodiment having n=8 MPL circuits 306(1)–306(8) each receiving k=256 match lines, the priority encoder 502 generates a 3-bit set ID to indicate which of the MPL circuits 306(1)–306(8) generated the highest priority set index that is rippled through the MPL circuits to the control circuit 500. The 3-bit set ID is then concatenated with the y=log$_2$256=8-bit rippled set index I_set to form an 11-bit I_dev.

Table 1 illustrates the various logic states of SEL_1 to SEL_8 according to the highest priority set having a match condition, where d/c indicates a don't care state. For example, if match line set ML_5 is the highest priority set that has a match condition, the select signal SEL_5 is asserted to logic 1 so that MPL circuit 306(5) provides the highest priority index generated therein as the input set index to the next MPL circuit 306(6). The select signals SEL_6 to SEL_8 are de-asserted to logic 0 so that the set index generated in MPL circuit 306(5) is rippled through respective MPL circuits 306(6)–306(8) to the control circuit 500 and used to form the device index I_dev. Since MPL circuit 306(5) forwards its own set index to the next MPL circuit 306(6), the input index to MPL circuit 306(5) is not selected, and therefore the state of the previous select signals SEL_1 to SEL_4 are d/c's.

gates 610 and 612 with the match logic circuit 604. Further, in actual embodiments, OR gate 626 may be implemented using a NOR gate and an inverter.

The priority encoder 602 receives match flags MF_1 to MF_3, and includes inverters 629 and 631, NAND gate 630, AND gate 632, and a NOR gate 628. Inverter 629 generates $\overline{MF\_2}$, and inverter 631 generates $\overline{MF\_1}$. If the highest priority set having a match condition corresponds to the first match flag set MF_1, the priority encoder 602 asserts set_ID[1:0]="00". If the highest priority set having a match condition corresponds to the second match flag set MF_2, the priority encoder 602 asserts set_ID[1:0]="01". If the highest priority set having a match condition corresponds to the third match flag set MF_3, the priority encoder 602 asserts set_ID[1:0]="10". If the highest priority set having a match condition corresponds to the fourth match flag set MF_4, the priority encoder 602 asserts set_ID[1:0]="11". The 2-bit signal set_ID[1:0] is concatenated in the concatenation node 510 (see FIG. 5) with the set index rippled through the four MPL circuits 400 to form the device index I_dev.

The select circuit 608 receives set_ID[1:0], the first match flag MF_1, and the enable signal EN, and includes four AND gates 634, 636, 638, and 640, and two inverters 635 and 637. Inverter 635 generates $\overline{set\_ID\_1}$, and inverter 637 generates $\overline{set\_ID\_0}$. The AND gates 634, 636, 638, and 640 each include an input terminal to receive the enable

TABLE 1

| HP set | SEL_1 | SEL_2 | SEL_3 | SEL_4 | SEL_5 | SEL_6 | SEL_7 | SEL_8 |
|---|---|---|---|---|---|---|---|---|
| ML_1 | 1 | 0 | 0 | 0 | 0 | 0 | 0 | 0 |
| ML_2 | d/c | 1 | 0 | 0 | 0 | 0 | 0 | 0 |
| ML_3 | d/c | d/c | 1 | 0 | 0 | 0 | 0 | 0 |
| ML_4 | d/c | d/c | d/c | 1 | 0 | 0 | 0 | 0 |
| ML_5 | d/c | d/c | d/c | d/c | 1 | 0 | 0 | 0 |
| ML_6 | d/c | d/c | d/c | d/c | d/c | 1 | 0 | 0 |
| ML_7 | d/c | d/c | d/c | d/c | d/c | d/c | 1 | 0 |
| ML_8 | d/c | d/c | d/c | d/c | d/c | d/c | d/c | 1 |

Figure 6:
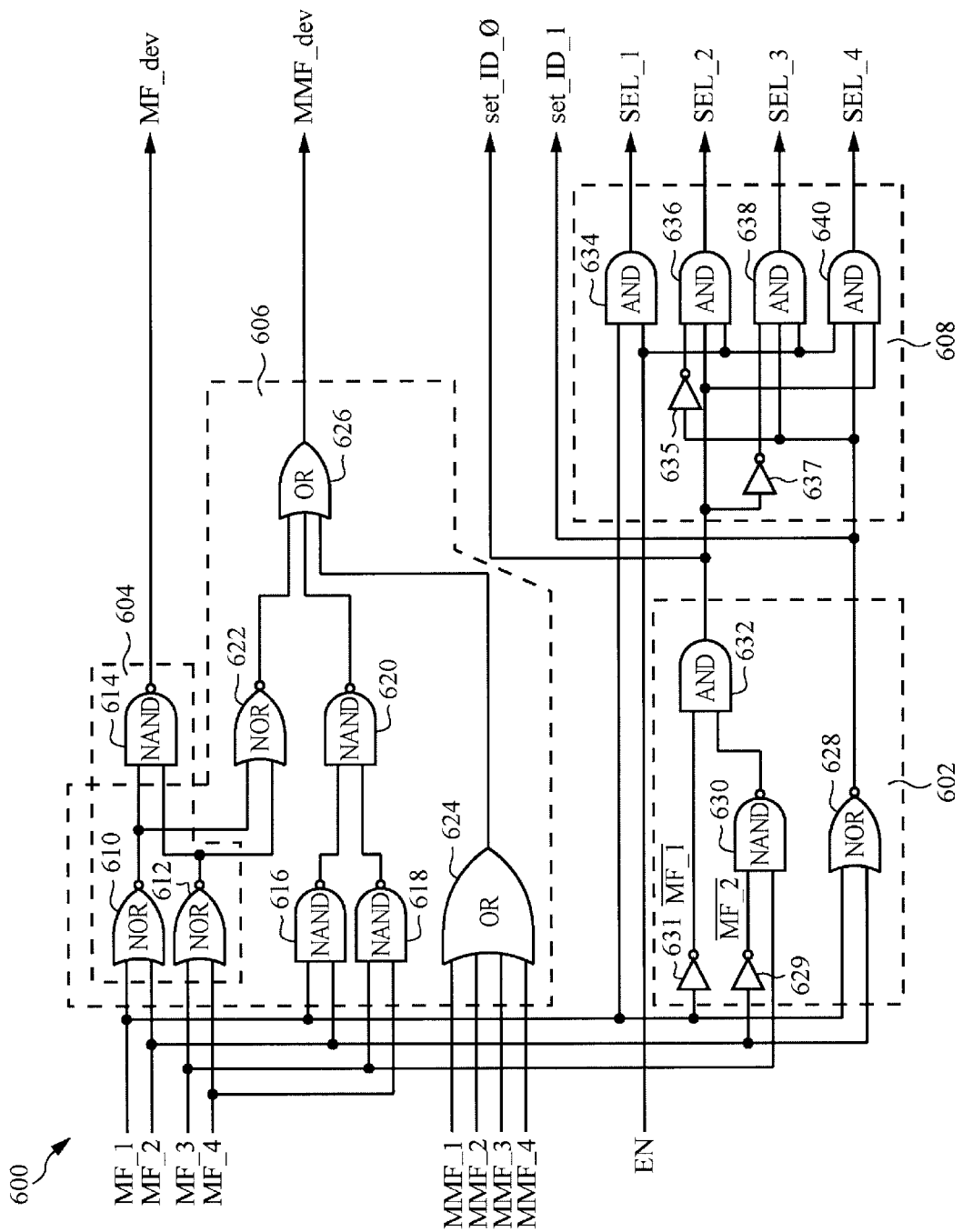
FIG. 6 is a gate level diagram of one embodiment of the control circuit of FIG. 5.

FIG. 6 shows a control circuit 600 configured to receive four match flags MF_1 to MF_4 and four multiple match flags MMF_1 to MMF_4 from four corresponding MPL circuits 400(1)–400(4), as well as an active high enable signal EN. The control circuit 600, which is one embodiment of the control circuit 500 of FIG. 5, includes a priority encoder 602, a match logic circuit 604, a multiple match logic circuit 606, and a select circuit 608. For simplicity, the concatenation node 510 is not shown in FIG. 6. In response to MF_1 to MF_4 and MMF_1 to MMF_4, the control circuit 600 generates MF_dev, MMF_dev, a 2-bit set_ID [1:0], and SEL_1 to SEL_4.

The match logic circuit 604, which is one embodiment of the match logic circuit 504 of FIG. 5, receives the four match flags MF_1 to MF_4, and includes NOR gates 610 and 612 and a NAND gate 614. If any of the match flags MF_1 to MF_4 are asserted, the NAND gate 614 asserts its output signal, MF_dev, to logic high to indicate the match condition for the device.

The multiple match logic circuit 606 receives the four match flags MF_1 to MF_4 and the four multiple match flags MMF_L to MMF_4, and includes NAND gates 616, 618, and 620, NOR gate 622, and OR gates 624 and 626. If any of the multiple match flags MMF_1 to MMF_4 are asserted, or if two or more of the match flags MF_1 to MF_4 are asserted, the OR gate 626 asserts its output signal, MMF_dev, to logic high to indicate the multiple match condition for the device. Note that in the embodiment shown in FIG. 6, the multiple match logic circuit 606 shares NOR signal EN, although in other embodiments, the enable signal EN may be omitted. In such other embodiments, the AND gate 634 may be omitted, and AND gates 636, 638, and 640 may be 2-input logic gates rather than 3-input logic gates. The AND gates 636, 638, and 640, which in actual embodiments may each be implemented using a NAND gate and an inverter, generate the four select signals SEL_1 to SEL_4 according to the truth table above in Table 1.

Figure 7:
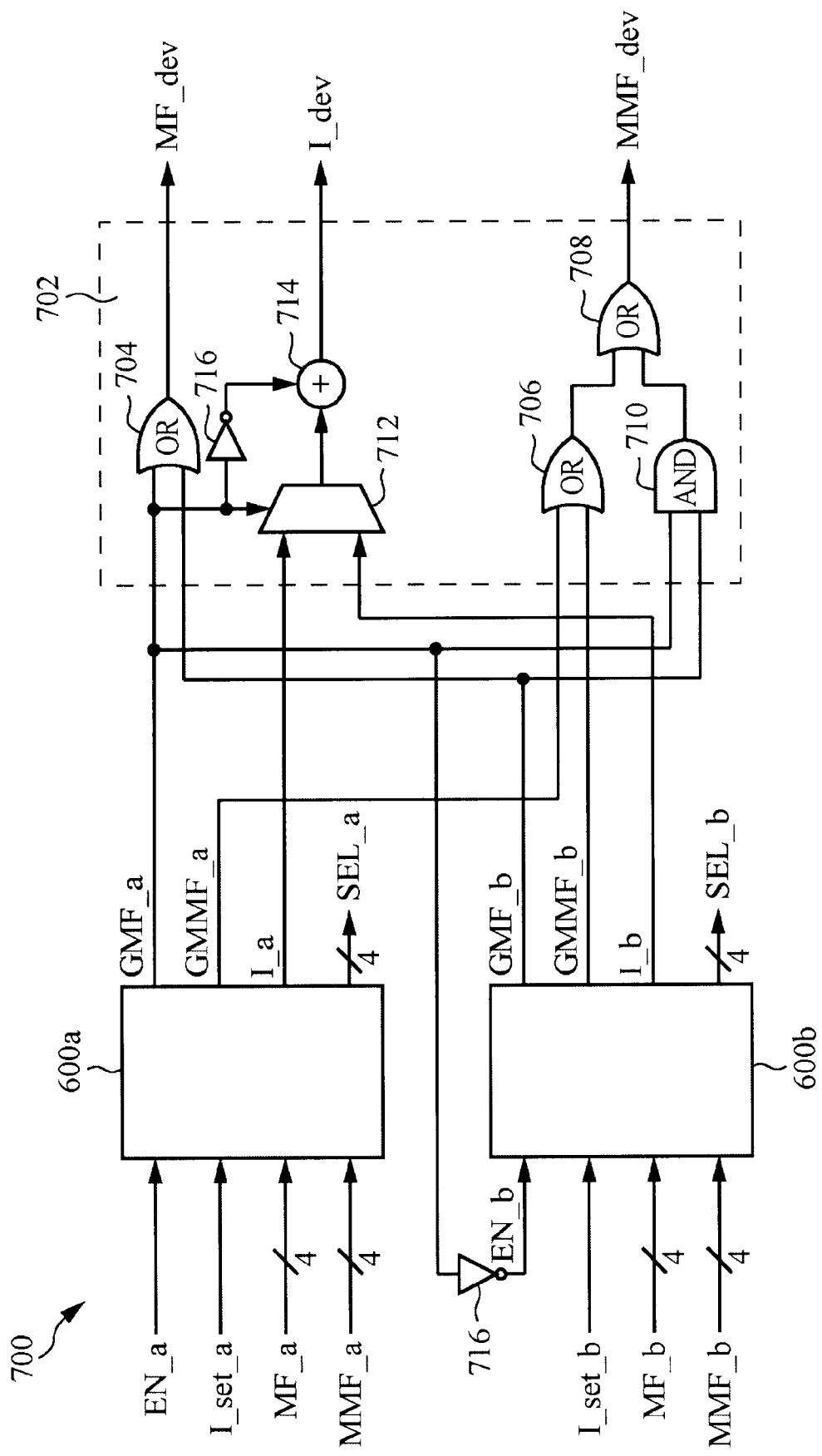
FIG. 7 is a block diagram illustrating the interconnection of two control circuits of FIG. 6.

In one embodiment, two of the control circuits 600 of FIG. 6 are connected together to form a control circuit 700 that can receive eight match flags MF_1 to MF_8 and multiple match flags MMF_1 to MMF_8 from eight corresponding MPL circuits 400(1)–400(8). Referring to FIG. 7, the control circuit 700 includes two control circuits 600*a* and 600*b* connected to a logic circuit 702 including OR gates 704, 706, and 708, an AND gate 710, a MUX 712, a concatenation node 714, and an inverter 716. The first control circuit 600*a* receives four match flags MF_a[3:0] and multiple match flags MMF_a[3:0] from a first group of four MPL circuits 400(1)–400(4) (not shown in FIG. 7) and, in response thereto, generates a group match flag GMF_a and a group multiple match flag GMMF_a, generates the highest priority matching index I_a for the first group, and generates four select signals SEL_a[3:0] for the corresponding group of MPL circuits 400(1)–400(4), as described above with respect to FIG. 6.

Similarly, the second control circuit 600*b* receives four match flags MF_b[3:0] and multiple match flags MMF_b [3:0] from a second group of four MPL circuits 400(5)–400

(8) (not shown in FIG. 7) and, in response thereto, generates a group match flag GMF_b and a group multiple match flag GMMF_b, generates the highest priority matching index I_b for the second group, and generates four select signals SEL_b[3:0] for the corresponding group of MPL circuits 400, as described above with respect to FIG. 6. For purposes of discussion herein, the first group of MPL circuits 400(1)–400(4) connected to the first control circuit 600a are of a higher priority than the second group of MPL circuits 400(5)–400(8) connected to the second control circuit 600b. GMF_a controls the enable input to control circuit 600b via inverter 716 such that when control circuit 600a detects a match condition, the select signals SEL_b are disabled.

The group match flags GMF_a and GMF_b are combined in the OR gate 704 to generate the device match flag MF_dev. The group match flags GMF_a and GMF_b are also combined in the AND gate 710, and the group multiple match flags GMMF_a and GMMF_b are combined in the OR gate 706. The output signals of OR gate 706 and AND gate 710 are combined in the OR gate 708 to generate the device multiple match flag MMF_dev. Thus, the OR gate 708 asserts MMF_dev to logic high if (1) either GMMF_a or GMMF_b is asserted, or (2) if both GMF_a and GMF_b are asserted.

The output set indexes I_a and I_b generated by respective control circuits 600a and 600b are provided to first and second input terminals of the MUX 712. In response to the first group match flag GMF_a, the MUX 712 selectively forwards either I_a or I_b to the concatenation node 714, which in turn adds the complement of the logic state of GMF_a as the MSB to the index provided by the MUX 712 to form the device index I_dev. For example, if there is match detected within the first group of MPL circuits 400, the asserted logic high state of GMF_a causes the MUX 712 to output the index I_a to the concatenation node 714. The logic high state of GMF_a is inverted by the inverter 716, and the resulting logic zero value is added as the MSB to I_a to form I_dev. Conversely, if there is not a match detected by the first control circuit 600a, the resulting logic low state of GMF_a causes the MUX 712 to output the highest priority matching index I_b from the second control circuit 600b to the concatenation node 714. The logic low state of GMF_a is inverted by the inverter 716, and the resulting logic one value is added as the MSB to I_b to form I_dev.

Figure 8:
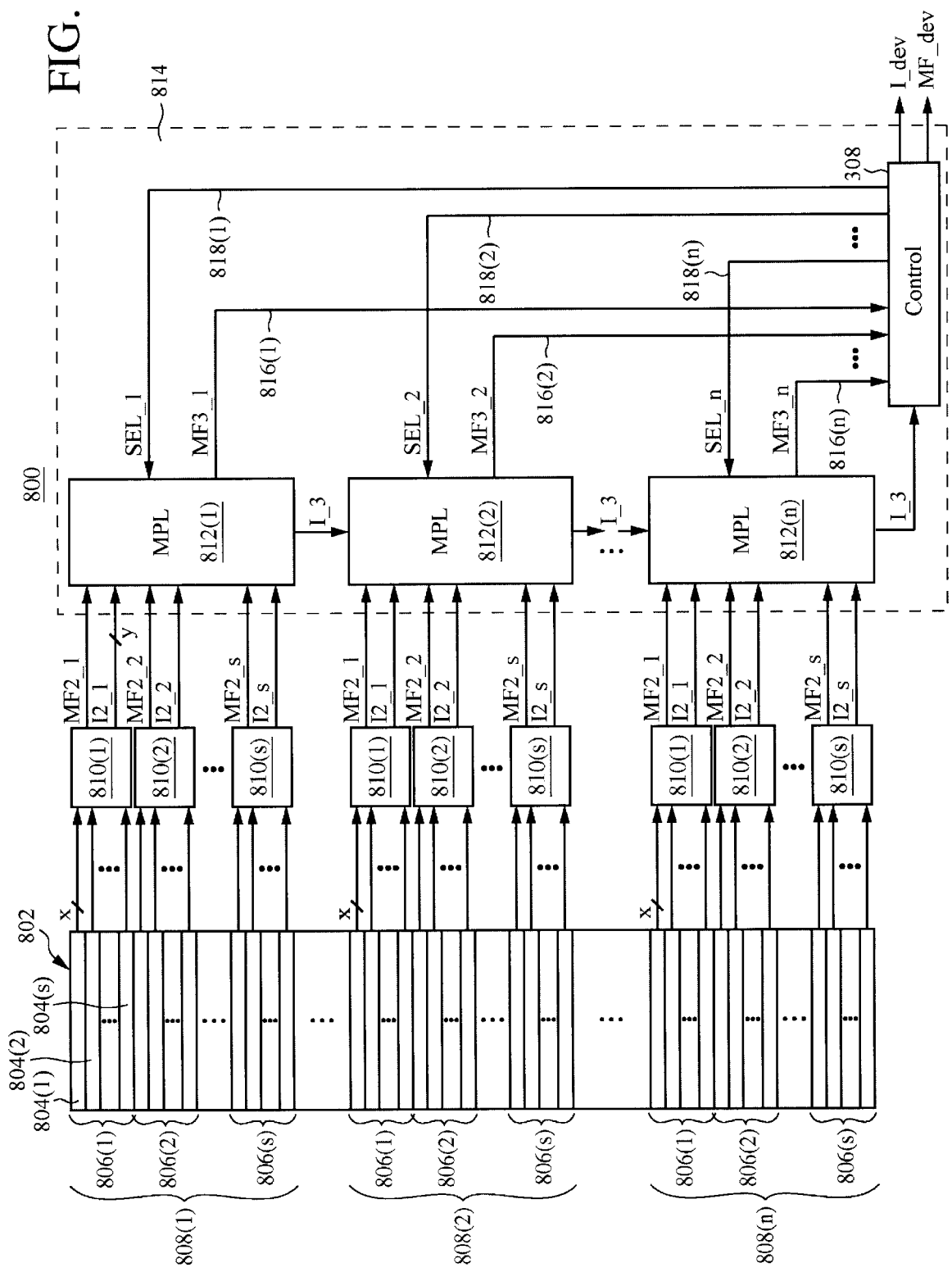
FIG. 8 is a block diagram illustrating a hierarchical priority logic circuit in accordance with the present invention.

Embodiments of the priority logic circuit 304 described above may be cascaded together in a hierarchical manner to generate a device index I_dev for larger CAM arrays. For example, FIG. 8 shows a CAM device 800 having a CAM array 802, a plurality of priority logic circuits 810 coupled to receive sets of match lines ML from the CAM array 802, and a priority logic circuit 814 coupled to receive match flags and indexes from the priority logic circuits 810. The priority circuit 814 includes n MPL circuits 812 connected in a chain with control circuit 308. The CAM array 802, which may be any suitable CAM array (e.g., synchronous, asynchronous, binary, or ternary), has a plurality of rows of CAM cells for storing a plurality of CAM words therein, where the rows of CAM cells are segmented into three hierarchical levels of groups 804, 806, and 808. In the first hierarchical level (L1), each group 804 includes x rows of CAM cells coupled to a corresponding set of x match lines ML. In the second hierarchical level (L2), each group 806 includes r of the L1 groups 804, where r sets of match lines ML from L1 groups 804(1)–804(r) within each L2 group 806 are coupled to a corresponding MPL circuit 810. In the third hierarchical level (L3), each of groups 808(1)–808(n) includes s of the L2 groups 806, and corresponds to MPL circuits 812(1)–812(n), respectively, of priority logic circuit 814. For other embodiments, CAM array 802 may be segmented into any number of levels of hierarchy coupled to corresponding MPL circuits in a manner consistent with that described above in FIG. 8.

During compare operations, a comparand word or search key is compared with the CAM words stored in the CAM array 802. For each matching CAM word, the corresponding match line ML is asserted (e.g., to logic high) to indicate the match condition. In response to the match line sets ML from its corresponding L2 group 806, each priority logic circuit 810 generates an L2 match flag MF2 indicative of match conditions in the L2 group 806, and also generates an index I2 of the highest priority match for the rows of CAM cells within the corresponding L2 group 806. For example, within each L3 group 808, priority logic circuit 810(1) generates L2 match flag MF2_1 and index I2_1 in response to the match line sets ML from the L1 groups 804(1)–804(r) within corresponding L2 group 806(1), priority logic circuit 810(2) generates L2 match flag MF2_2 and index I2_2 in response to the match line sets ML from the L1 groups 804(1)–804(r) within corresponding L2 group 806(2), and so on. In some embodiments, the priority logic circuits 810 may be conventional circuits such as, for example, the index logic circuit 200 of FIG. 2. In other embodiments, the priority logic circuits 810 may be the priority logic circuit 304 of the present invention, operation of which is described above with respect to FIG. 3.

The L2 match flags MF2_1 to MF2_s and set indexes I2_1 to I2_s generated by priority logic circuits 810(1)–810(s) associated with each L3 group 808 are provided to a corresponding MPL circuit 812 of the priority logic circuit 814. For example, MPL circuit 812(1) receives L2 match flags MF2_1 to MF2_s and indexes I2_1 to I2_s from priority logic circuits 810(1)–810(s) associated with L3 group 808(1), MPL circuit 812(2) receives match flags MF2_1 to MF2_s and indexes I2_1 to I2_s from priority logic circuits 810(1)–810(s) associated with L3 group 808(2), and so on.

The MPL circuits 812(1)–812(n) and control circuit 308 of priority logic circuit 814 generate index I_dev for the entire CAM array 802 in a manner similar to that of MPL circuits 306(1)–306(n) and control circuit 308 of priority logic circuit 304 of FIG. 3. Thus, for each MPL circuit 812(1)–812(n), if any within the groups of L2 match flags MF2 provided thereto indicates a match condition within the corresponding L3 group 808(1)–808(n), respectively, the MPL circuit 812 asserts (e.g., to logic high) a corresponding L3 match flag MF3, and generates the index I3 of the highest priority match within the corresponding group 808.

The L3 match flags MF3_1 to MF3_n are provided to the control circuit 308 via signal lines 816(1)–816(n), respectively. In response to the L3 match flags MF3_1 to MF3_n, the control circuit 308 generates select signals SEL_1 to SEL_n, which in turn are provided to the MPL circuits 812(1)–812(n) via signal lines 818(1)–818(n), respectively. As described above, in response to respective select signals SEL_1 to SEL_n, each of the MPL circuits 812(1)–812(n) selectively forwards either the L3 index generated therein or the L3 index received from the previous MPL circuit to the next MPL circuit. The control circuit 308 selectively asserts the select signals SEL_1 to SEL_n in the manner described above with respect to FIGS. 3–5 so that the index of the highest priority match for the entire CAM array 802 ripples through one or more of the MPL circuits 812(1)–812(n) to the control circuit 308 to form the LSB's of I_dev, which the index or address of the highest priority match in the entire CAM array 802.

Control circuit 308 also generates the MSB's of I_dev in response to L3 match flags MF3_1 to MF_n in the manner described above. The MSB's of I_dev indicate which L3 group 808(1)–808(n) contains the highest priority match in the entire array 802, and thus also indicates which of the MPL circuits 812(1)–812(n) generated the L3 index that forms the LSB's of I_dev. Thus, for one embodiment, each L3 group 808(1)–808(n) has a group or block address or index. For example, the sets of rows of CAM cells associated with L3 group 808(1) may have a group address of 0, the sets of rows of CAM cells associated with L3 group 808(2) may have a group address of 1, and so on. Thus, in one embodiment, control circuit 308 encodes the L3 match flags MF_1 to MF_n to generate the MSB's of I_dev.

Additionally, control circuit 308 may also generate a device match flag MF_dev for the entire CAM array 802 in response to the L3 match flags MF3_1 to MF3_n. Further, in some embodiments, control circuit 308 may generate a device multiple match flag (not shown) indicative of a multiple match condition for the entire CAM array 802. In such embodiments, each MPL circuit 812(1)–812(n) may provide an L3 multiple match flag (not shown) indicative of a multiple match condition within its corresponding L3 group 808(1)–808(n), respectively to control circuit 308, which in turn generates the device multiple match flag in response to the L3 match flags MF3_1 to MF3_n and the L3 multiple match flags (not shown).

Figure 9:
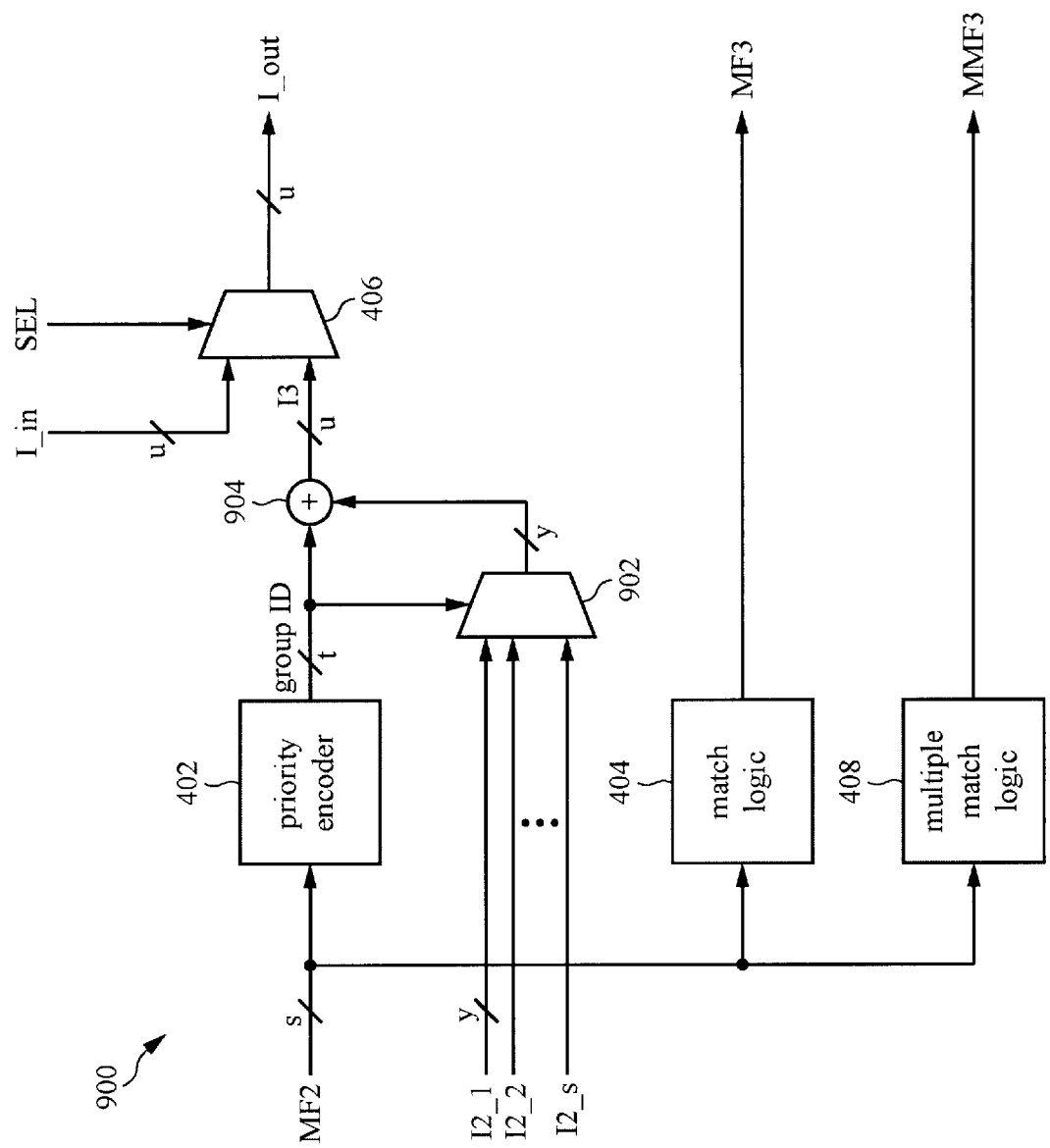
FIG. 9 is a block diagram of one embodiment of the MPL circuit shown in FIG. 8.

FIG. 9 shows an MPL circuit 900 that is one embodiment of the MPL circuit 812 of FIG. 8. The MPL circuit 900 includes the priority encoder 402, match logic circuit 404, MUX 406, and multiple match logic circuit 408 described above with respect to the MPL circuit 400 of FIG. 4, and also includes a MUX 902 and a concatenation node 904. The L2 indexes I2_1 to I2_s generated by the priority logic circuits 810(1)–810(s) associated with a corresponding L3 group 808 are provided as input signals to MUX 902. The L2 match flags MF2_1 to MF2_s from associated priority logic circuits 810(1)–810(s), respectively, are provided as input signals to the priority encoder 402, the match logic circuit 404, and the multiple match logic circuit 408. The match logic circuit 404 asserts L3 match flag MF3 if there is a match condition within its corresponding L3 group 808, as indicated by the L2 match flags MF2. The multiple match logic circuit 408 asserts an L3 multiple match flag MMF3 if there is a multiple match condition within the corresponding L3 group 808. In some embodiments, the multiple match logic circuit 408 may be omitted.

In response to the L2 match flags MF2_1 to MF2_s, the priority encoder 402 generates a group ID corresponding to the highest-priority circuit 810 that asserts its L2 match flag. The group ID, which is t=log$_2$s bits wide, is provided as a select signal(s) to MUX 902 and as an input signal(s) to the concatenation node 904. In response to the group ID, MUX 902 outputs the L2 index I2 corresponding to the highest priority circuit 810 that asserts its L2 match flag to the concatenation node 904. The concatenation node 904 concatenates the group ID (as the MSB's) with the L2 index provided by MUX 902 (as the LSB's) to form an L3 index I3, which is the index of the highest priority match within the corresponding L3 group 808. The index I3, which is u=y+t bits wide, is provided as an input signal(s) to a first input terminal of MUX 406. The second input terminal of MUX 406 is coupled to receive an input L3 index I_in from the previous MPL circuit 812 in the chain. In response to the select signal SEL received from control circuit 308, MUX 406 outputs either the L3 index I3 generated within the MPL circuit 900 or the input L3 index I_in received from the previous MPL circuit in the chain as an output L3 index I_out, which in turn is provided as I_in to the next MPL circuit in the chain.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. Specifically, the respective logic structures of the match logic circuits, the multiple match logic circuits, the priority encoders, and the select circuits described herein may be modified as desired without departing from the scope of the invention.

What is claimed is:

1. A match flag and priority encoding architecture comprising:
    a number of match and priority encoding logic (MPL) circuits connected in a chain, each comprising:
        a plurality of input terminals coupled to an associated set of match lines from a content addressable memory (CAM) array;
        an index input port coupled to an index output port of a previous MPL circuit in the chain; and
        a select terminal to receive a select signal; and
    a control circuit having a number of inputs each to receive a match flags from a corresponding MPL circuit, an index input port coupled to the index output port of the last MPL circuit in the chain, and a number of outputs each coupled to the select terminal of a corresponding MPL circuit.

2. The architecture of claim 1, wherein each MPL circuit further comprises:
    a priority encoder coupled to the plurality of input terminals and having an output to provide a highest priority match index for the associated set of match lines; and
    a multiplexer having a first input terminal coupled to the input index port, a second input terminal coupled to the output of the priority encoder, a control terminal coupled to the select terminal, and an output terminal.

3. The architecture of claim 2, wherein the multiplexer selectively forwards either an input index from the index input port or the highest priority match index as an output index in response to the select signal.

4. The architecture of claim 1, wherein each MPL circuit further comprises:
    a match logic circuit having a plurality of inputs coupled to the associated set of match lines, and having an output to provide the match flag indicating a match condition within the associated set of match lines.

5. The architecture of claim 4, wherein each MPL circuit further comprises:
    a multiple match logic circuit having a plurality of inputs coupled to the associated set of match lines, and having an output to provide a multiple match flag indicating a multiple match condition within the associated set of match lines.

6. The architecture of claim 1, wherein the control circuit further comprises:
    a priority encoder having a number of inputs to receive the match flags, and an output; and
    a select circuit having an input port coupled to the output of the priority encoder and having a number of outputs to provide the select signals to corresponding MPL circuits.

7. The architecture of claim 6, wherein the select circuit comprises a decoder.

8. The architecture of claim 6, wherein the control circuit further comprises:
    a match logic circuit having a number of inputs to receive the match flags.

9. The architecture of claim 8, wherein the control circuit further comprises:
    a multiple match flag logic circuit having a number of inputs to receive the match flags.

10. The architecture of claim 6, wherein the control circuit further comprises:

a concatenation node having a first input coupled to the output of the priority encoder, a second input coupled to the index input port of the control circuit, and an output to provide a device index.

11. A match logic and priority encoding (MPL) circuit, comprising:

a plurality of match flag inputs, each for receiving a match flag for a corresponding set of match lines of a content addressable memory (CAM) array;

a plurality of index inputs, each for receiving a highest priority match index for a corresponding set of the match lines;

an index input port to receive an input index from a previous MPL circuit; and an index output port to provide an output index.

12. The MPL circuit of claim 11, further comprising:

a priority encoder having inputs to receive the match flags, and having an output;

a first multiplexer having inputs to receive the highest priority match indexes, a control terminal coupled to the output of the priority encoder, and an output;

a concatenation node having a first input coupled to the output of the priority encoder, a second input coupled to the output of the first multiplexer, and an output; and a second multiplexer having a first input coupled to the index input port, a second input coupled to the output of the concatenation node, a control terminal to receive a select signal, and an output coupled to the index output port.

13. The MPL circuit of claim 12, further comprising:

a match logic circuit having inputs to receive the match flags and having an output to provide a device match flag.

14. The MPL circuit of claim 13, further comprising:

a multiple match logic circuit having inputs coupled to receive the match flags and having an output to provide a device multiple match flag.

15. A match logic and priority encoding (MPL) circuit, comprising:

means for receiving a plurality of match flags, each indicating a match condition for a corresponding set of rows of a content addressable memory (CAM) array;

means for receiving a plurality of set indexes, each indicating the highest priority match for a corresponding set of the CAM rows;

means for receiving an input index from a previous MPL circuit; and means for providing an output index.

16. The MPL circuit of claim 15, further comprising:

means for generating a group identification (ID) indicating the highest priority match flag that is asserted;

means for selecting one of the set indexes in response to the group ID;

means for concatenating the group ID to the selected set index; and means for selectively forwarding either the input index or the output of the concatenation means as the output index.

17. The MPL circuit of claim 16, wherein the means for generating comprises a priority encoder.

18. The MPL circuit of claim 16, wherein the means for selecting comprises a multiplexer.

19. The MPL circuit of claim 16, wherein the means for selectively forwarding comprises a multiplexer.

20. The MPL circuit of claim 15, further comprising:

means for generating a device match flag in response to the match flags.

21. The MPL circuit of claim 15, further comprising:

means for generating a device multiple match flag in response to the match flags.

22. A match flag and priority encoding architecture comprising:

a number of match and priority encoding logic (MPL) circuits connected in a chain, each comprising:

means for receiving a plurality of match signals from an associated set of match lines of a content addressable memory (CAM) array;

means for generating a highest priority match index in response to the match signals;

means for receiving an input index from a previous MPL circuit in the chain; and means for selectively outputting the highest priority match index or the input index to a next MPL circuit in the chain in response to a select signal; and means for generating the select signals in response to a number of match flags, each match flag generated by a corresponding MPL circuit.

23. The architecture of claim 22, wherein the means for generating comprises:

a priority encoder having a number of inputs to receive the match flags, and an output; and a select circuit having an input port coupled to the output of the priority encoder and having a number of outputs to provide the select signals to corresponding MPL circuits.

24. The architecture of claim 22, wherein the means for generating further comprises:

a concatenation node having a first input coupled to the output of the priority encoder, a second input to receive an index from the last MPL circuit in the chain, and an output to provide a device index.

25. A method for generating a device index for a CAM array having a plurality of sets of match lines, comprising:

providing a plurality of match and priority encoding logic (MPL) circuits connected in a chain, each MPL circuit having inputs to receive match signals from a corresponding set of match lines;

generating, in each MPL circuit, a highest priority match index and a match flag in response to the corresponding set of match signals;

receiving, in each MPL circuit, an input index provided by a previous MPL circuit;

generating a plurality of select signals in response to the match flags; and selectively outputting, in each MPL circuit, either the highest priority match index or the input index in response to a corresponding select signal.

26. The method of claim 25, further comprising:

generating a set ID in response to the match flags; and concatenating the set ID to the index provided by the last MPL circuit in the chain to generate the device index.

27. The method of claim 25, further comprising:

generating a multiple match flag in each MPL circuit.

* * * * *